United States Patent [19]

Shiozawa et al.

[11] Patent Number: 5,392,303

[45] Date of Patent: Feb. 21, 1995

[54] FREQUENCY STABILIZATION METHOD OF SEMICONDUCTOR LASER, FREQUENCY-STABILIZED LIGHT SOURCE AND LASER MODULE

[75] Inventors: Takahiro Shiozawa; Masayuki Yamaguchi; Naoya Henmi, all of Tokyo, Japan

[73] Assignee: NEC Corporation, Tokyo, Japan

[21] Appl. No.: 220,223

[22] Filed: Mar. 30, 1994

[30] Foreign Application Priority Data

Mar. 30, 1993 [JP] Japan .................................. 5-071398
May 31, 1993 [JP] Japan .................................. 5-128569

[51] Int. Cl.$^6$ .............................................. H01S 3/13
[52] U.S. Cl. ........................................ 372/32; 372/35;
                                                 372/34; 372/26; 372/38
[58] Field of Search ................... 372/32, 29, 26, 35,
                                                 372/34, 38

[56] References Cited

U.S. PATENT DOCUMENTS

| | | | |
|---|---|---|---|
| 4,821,273 | 4/1989 | Hori et al. ............................. | 372/32 |
| 4,847,851 | 7/1989 | Dixon .................................... | 372/75 |
| 4,908,829 | 3/1990 | Kruglii et al. ......................... | 372/34 |
| 5,042,042 | 8/1991 | Hori et al. ............................. | 372/32 |
| 5,181,214 | 1/1993 | Berger et al. .......................... | 372/36 |
| 5,265,115 | 11/1993 | Amano .................................. | 372/34 |
| 5,267,252 | 11/1993 | Amano .................................. | 372/36 |
| 5,287,367 | 2/1994 | Yanagawa .............................. | 372/32 |

FOREIGN PATENT DOCUMENTS

64-74780   3/1989   Japan .
1-238083   9/1989   Japan .

OTHER PUBLICATIONS

By T. Yanagawa et al., "Frequency stabilization of an InGaAsP distributed feedback laser to an NH$_3$ absorption line a 15137 A with an external frequency modulator", Appl. Phys. Lett., Nov. 15, 1985, vol. 47, No. 10, pp. 1036–1038.

By Y. Chung et al., "Frequency-Locking of 1.5-μm InGaAsP Lasers to an Atomic Krypton Line Without Dithering the Laser Frequency", IEEE Photonics Technology Letters, Jun. 1990, vol. 2, No. 6, pp. 435–437.

By H. Lee et al., "Frequency stabilization of a directly modulated semiconductor laser", Rev. Sci. Instrum., Sep. 1990, vol. 61, No. 9, pp. 2478–2480.

By Y. Sakai et al., "Frequency Stabilization of Laser Diodes Using 1.51–1.55 μm Absorption Lines of $^{12}C_2H_2$ and $^{13}C_2H^2$", IEEE Journal of Quantum Electronics, Jan. 1992, vol. 28, No. 1, pp. 75–81.

By J. Braasch et al., "Frequency Stabilisation of Monomode Semiconductor Lasers to Birefringent Resonators" Electronic Letters, Apr. 23, 1992, vol. 28, No. 9, pp. 849–851.

*Primary Examiner*—Léon Scott, Jr.
*Attorney, Agent, or Firm*—Young & Thompson

[57] ABSTRACT

A frequency stabilization method of a semiconductor laser is provided. A driving current, a forward voltage and an output light power of the laser mounted on a heat sink is detected. A temperature of the heat sink is also detected. A consumption power of the laser is obtained from the driving current and voltage thus detected, providing a relationship between the output light power and the consumption power. The driving current is controlled so that the output light power is kept constant, and the temperature of the heat sink is controlled based on the relationship so that a temperature of an active layer of the laser is maintained. The output light power is kept constant and at the same time, any temperature change of the active layer is cancelled through the temperature control of the heat sink. Even if the consumption power changes due to an leakage current and/or a recombination current without luminescence to maintain the output light power during long time operation, the temperature of the active layer is maintained by cancelling the consumption power change through the temperature control of the heat sink. Thus, the oscillation frequency of the semiconductor laser can be stabilized at a given value.

24 Claims, 7 Drawing Sheets

F I G. 7
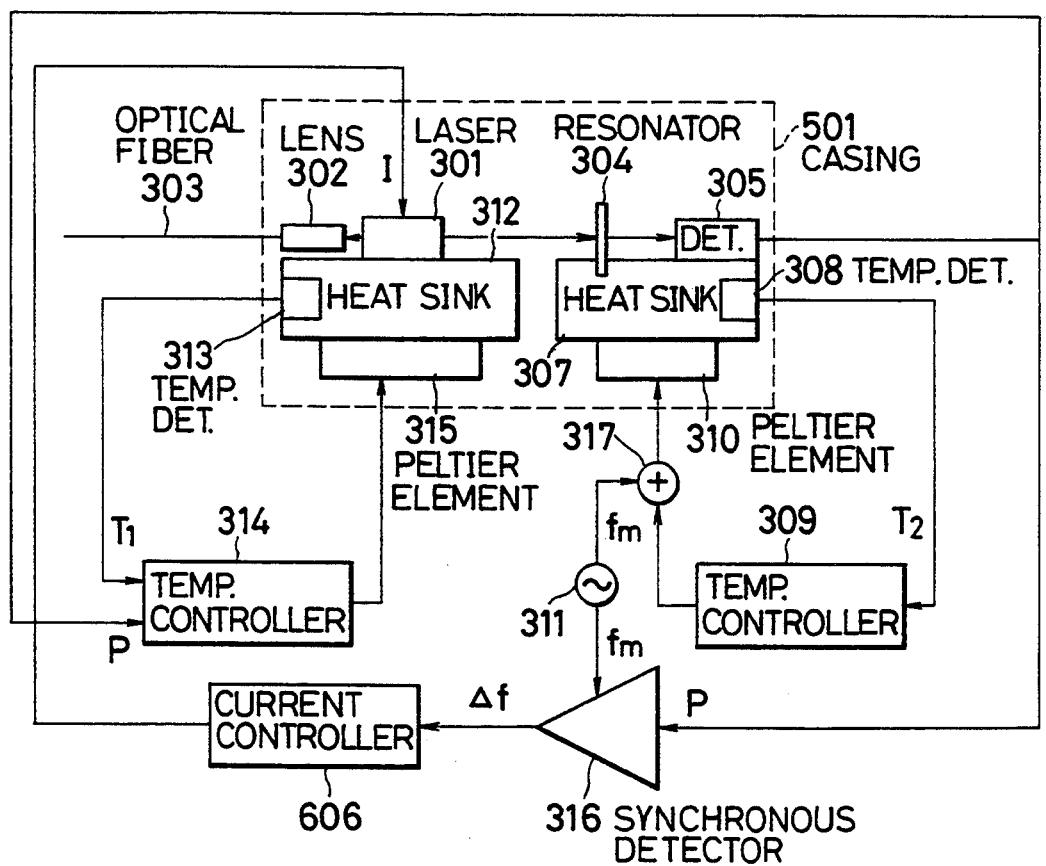

FREQUENCY STABILIZATION METHOD OF SEMICONDUCTOR LASER, FREQUENCY-STABILIZED LIGHT SOURCE AND LASER MODULE

BACKGROUND OF THE INVENTION

1. Field of the Invention

The present invention relates to a semiconductor laser and more particularly, to a frequency stabilization method of a semiconductor laser, a frequency-stabilized light source and a semiconductor laser module used for the method.

2. Description of the Prior Art

A conventional frequency stabilization method of a semiconductor laser is disclosed in the IEEE Journal of Quantum Electronics, Vol. 28, No. 1, Page 75, Jan. 1992, in which an oscillation frequency of the laser is stabilized at an absorption line frequency of acetylene. FIG. 1 shows a functional block diagram of the conventional frequency stabilization method.

In FIG. 1, the ambient temperature of a semiconductor laser 701 is kept constant by a temperature controller 702. A DC power supply 709 supplies a driving current to the laser 701. The driving current is slightly modulated in frequency by a modulation signal outputted from an oscillator 703, resulting in frequency-modulated output light beams of the laser 701.

One of the output light beams of the laser 701 is emitted from aside face of the laser 701 and used for a given application. The other of the output light beams of the laser 701 is emitted from its opposite side face and goes through an optical lens system 708 to be injected into an acetylene ($C_2H_2$) gas cell 704. The light beam transmitted through the acetylene gas cell 704 is detected by a photodetector 705 to produce an electrical output signal. The electrical output signal is inputted into an lock-in amplifier 706 to be detected synchronously with the modulation frequency from the oscillator 703.

The lock-in amplifier 706 produces an electrical output signal proportional to a difference or error between the oscillation frequency of the laser 701 and one of absorption peak frequencies of acetylene in the cell 704. The electrical output signal from the amplifier 706 is fed-back to the driving current through a PID controller 707 in which a Proportional, Integral and Differential (PID) controlling method is employed. Thus, the laser 701 is controlled so that its oscillation frequency is kept to be in accordance with the absorption peak frequency of acetylene.

Due to high stability in the absorption peak frequency, the oscillation frequency of the semiconductor laser 701 can be highly stabilized or locked.

With the conventional frequency stabilization method shown in FIG. 1, to obtain the difference or error between the oscillation frequency and the absorption peak frequency, the gas cell 704 and the lock-in amplifier 706 are required, and the driving current is modulated in frequency to be injected into the laser 701. As a result, there arises disadvantages that large-sized and expensive setups or apparatuses are necessary for carrying out the method and no unmodulated output light beam can be obtained.

In the case of stabilizing the optical output power of the laser 701 during operation, there is another disadvantage that another photodetector is necessary in addition to the photodetector 705.

Further, there is still another disadvantage that stabilizable oscillation frequencies are restricted to the absorption peak frequencies of the gas in the cell 704, so that any or arbitrary oscillation frequencies cannot be selected.

Another conventional frequency stabilization method of a semiconductor laser is disclosed in the Japanese Non-Examined Patent Publication No. 64-74780, Mar. 1989, in which a semiconductor laser temperature is detected from a forward voltage of the laser to keep the temperature constant. FIG. 2 shows a functional block diagram of the conventional frequency stabilization method.

In FIG. 2, a semiconductor laser 803 and a Peltier element 802 which generates and absorbs heat are arranged in a thermostatic bath 803. The laser 803 is driven by a constant current supplied from a DC current source 804. A differential amplifier 805 detects between input terminals or electrodes of the laser 803 its forward voltage drop $V_f$, and sends an electrical output signal proportional the voltage drop $V_f$ to a temperature controller 806.

In response to the output signal from the amplifier 805, the controller 806 increases or decreases a driving current for the Peltier element 801 to thereby keep the temperature of the laser 803 constant.

In general, the forward voltage drop $V_f$ of the semiconductor laser 803 is expressed as $$V_f = \frac{k \cdot I_n \left(1 + \frac{I_f}{I_0}\right)}{e \cdot T} \tag{1}$$

where $I_0$ is the forward saturation current, $I_f$ is a driving or exciting current, T is the absolute temperature of the laser 803, e is the charge of an electron and k is the Boltzmann's constant.

To be seen from the equation (1), the forward voltage drop $V_f$ is inversely proportional to the absolute temperature T. Thus, the absolute temperature T of the laser 803 can be exactly measured from the voltage drop $V_f$.

The differential amplifier 805 produces an output signal relating to the absolute temperature T from the detected voltage drop $V_f$ and sends the signal to the temperature controller 806. In response to the signal, the controller 806 controls to keep the temperature of the laser 803 constant.

The oscillation frequency of the semiconductor laser 803 is decided by the absolute temperature T and driving current $I_f$, so that it can be seen that the oscillation frequency is stabilized if both of them are kept constant.

With the another conventional frequency stabilization method shown in FIG. 2, an error tends to arise in detection of the absolute temperature T through the differential amplifier 805 because the laser 803 has an leakage current and a recombination current without luminescence both of which increase with the passage of time, providing fluctuation or deviation in the absolute temperature T and driving current $I_f$.

As a result, there arises a disadvantage that the output light power and oscillation frequency of the laser 803 deviate from the given values, respectively.

In addition to the above methods, still another conventional frequency stabilization method of a semiconductor laser is disclosed in the Japanese Non-Examined Patent Publication No. 1-238083, Sep. 1989. In the method, similar to the conventional method shown in FIG. 2, absorption peak frequencies of a gas is used.

SUMMARY OF THE INVENTION

An object of the present invention is to provide a frequency stabilization method of a semiconductor laser and a frequency-stabilized light source in which only a simple, compact and low-cost setup is necessary.

A further object of the present invention is to provide a frequency stabilization method of a semiconductor laser and a frequency-stabilized light source in which an output light power and an oscillation frequency of the semiconductor laser can be maintained even if the laser operates for a long period of time.

Another object of the present invention is to provide a frequency stabilization method of a semiconductor laser and a frequency-stabilized light source in which unmodulated light output can be obtained.

Still another object of the present invention is to provide a frequency stabilization method of a semiconductor laser and a frequency-stabilized light source in which both of the oscillation frequency and the output light power of the laser can be stabilized.

Still another object of the present invention is to provide a frequency-stabilized semiconductor laser module which enables the semiconductor laser to operate stably.

According to a first aspect of the present invention, a frequency stabilization method of a semiconductor laser is provided, which includes the steps of detecting an output light power of a semiconductor laser mounted on the heat sink, obtaining a consumption power of the laser, obtaining a relationship between the output light power and the consumption power, detecting a temperature of the heat sink, controlling a driving current for the laser so that the output light power is kept constant, and controlling the temperature of the heat sink based on the relationship so that a temperature of an active layer of the laser is maintained.

With the frequency stabilization method of the semiconductor laser according to the first aspect, the output light power is kept constant and at the same time, any temperature change of the active layer is cancelled through the temperature control of the heat sink. Therefore, even if the consumption power changes due to an leakage current and/or a recombination current without luminescence in order to maintain the output light power during long time operation, the temperature of the active layer is maintained by cancelling the consumption power change through the temperature control of the heat sink.

As a result, the oscillation frequency of the semiconductor laser can be stabilized at a given value for along time operation, which means no oscillation frequency drift. Additionally, the output light power also can be maintained.

Further, since no gas cell and no synchronous detection means are required, only a simple, compact and low-cost setup is sufficient for the method.

According to a second aspect of the present invention, a frequency-stabilized light source is provided, which enables the method of the first aspect to be carried out.

The light source includes a current detector for detecting a light power detector for detecting an output light power of a laser mounted on a heat sink, a light power detector for detecting an output light power of a semiconductor laser mounted on a heat sink, a first operator for obtaining a consumption power of the laser, a second operator for obtaining a relationship between the output light power and the consumption power, a temperature detector for detecting a temperature of the heat sink, a first controller for controlling the driving current so that the output light power is kept constant, and a second controller for controlling the temperature of the heat sink based on the relationship so that a temperature of an active layer of said laser is maintained.

With the frequency-stabilized light source according to the second aspect, the frequency stabilization method of the first aspect is carried out, so that the same effects or advantages as those in the first aspect can be obtained.

According to a third aspect of the present invention, a frequency stabilization method of a semiconductor laser is provided, which includes the steps of injecting an output light beam from a semiconductor laser into an optical resonator, modulating a temperature of the optical resonator by a modulation signal, detecting a transmitted light beam through the optical resonator to produce a first output signal, synchronously detecting the first output signal with the modulation frequency to produce a second output signal, controlling an oscillation frequency of the semiconductor laser to keep the frequency at a given value using the second output signal as a signal showing an error in the oscillation frequency.

With the frequency stabilization method of a semiconductor laser according to the third aspect, no gas cell is required, so that only a simple, compact and low-cost setup is sufficient for the method.

Since the output light beam from the semiconductor laser itself is not modulated and the temperature of the optical resonator is modulated, an unmodulated output light beam can be obtained easily.

According to a fourth aspect of the present invention, a frequency-stabilized light source is provided, which enables the method of the third aspect to be carried out.

The light source includes a semiconductor laser emitting an output light beam, an optical resonator into which the output light beam is injected, a modulator for modulating a temperature of the optical resonator by a modulation signal, a detector for detecting a transmitted light beam through the optical resonator to produce a first output signal, a synchronous detector for synchronously detecting the first output signal with the modulation frequency to produce a second output signal, a controller for controlling an oscillation frequency of the semiconductor laser to keep the frequency at a given value using the second output signal as a signal showing an error in the oscillation frequency.

with the frequency-stabilized light source according to the fourth aspect, the frequency stabilization method of the third aspect is carried out, so that the same effects or advantages as those in the third aspect can be obtained.

According to the fifth aspect of the present invention, a frequency stabilization method of a semiconductor laser is provided, which includes the steps of injecting an output light beam from a semiconductor laser into an optical resonator to produce a transmitted light having a peak frequency of the optical resonator, detecting the transmitted light beam having the peak frequency to produce an output signal about a detected power of the transmitted light beam, controlling the power of the transmitted light beam to be kept constant based on the output signal, and controlling an oscillation frequency of the semiconductor laser to be in accordance with the peak frequency.

With the frequency stabilization method of a semiconductor laser according to the fifth aspect, no gas cell is required, so that only a simple, compact and low-cost setup is sufficient for the method.

Since the power of the transmitted light beam is controlled to be kept constant and at the same time, the oscillation frequency of the laser is controlled to be in accordance with the peak frequency, both of the oscillation frequency and the output light power of the laser can be stabilized.

According to a sixth aspect of the present invention, a frequency-stabilized light source is provided, which enables the method of the fifth aspect to be carried out.

The light source includes a semiconductor laser emitting an output light beam, an optical resonator into which the output light beam is injected, the resonator producing a transmitted light beam and having a peak frequency of the transmitted light beam, a detector for detecting the transmitted light beam to produce an output signal about a detected power of the transmitted light beam, a first controller for controlling the power of the transmitted light beam to be kept constant based on the output signal, and a second controller for controlling an oscillation frequency of the semiconductor laser to be in accordance with the peak frequency.

With the frequency-stabilized light source according to the sixth aspect, the frequency stabilization method of the fifth aspect is carried out, so that the same effects or advantages as those in the fifth aspect can be obtained.

According to a seventh aspect of the present invention, a frequency-stabilized semiconductor laser module which can carry out the method of the third and fifth aspects is provided.

The module includes a first heat sink whose temperature is controllable, a semiconductor laser mounted on the first heat sink, the semiconductor laser emitting an output light beam, a second heat sink whose temperature is controllable, an optical resonator mounted on the second heat sink, the output light beam being injected into the optical resonator to emit a transmitted light beam from the optical resonator, a detector for receiving the transmitted light beam to detect a power of the transmitted light beam, and a package for incorporating the first heat sink, the semiconductor laser, the second heat sink, the optical resonator and the detector.

With the frequency-stabilized semiconductor laser module according to the seventh aspect, the first heat sink, the semiconductor laser, the second heat sink, the optical resonator and the detector are incorporated in the package, so that the semiconductor laser can operate stably.

Additionally, because the first heat sink for the laser and the second heat sink for the optical resonator are separated, the temperatures of the first and second heat sinks can be set independently. As a result, there is an advantage that the peak frequency of the optical resonator and the oscillation frequency of the laser can be minutely adjusted independently with each other.

BRIEF DESCRIPTION OF THE DRAWINGS

FIG. 7 is a functional block diagram of a frequency-stabilized light source according to a fifth embodiment of the present invention.

DETAILED DESCRIPTION OF THE PREFERRED EMBODIMENTS

Figure 1:
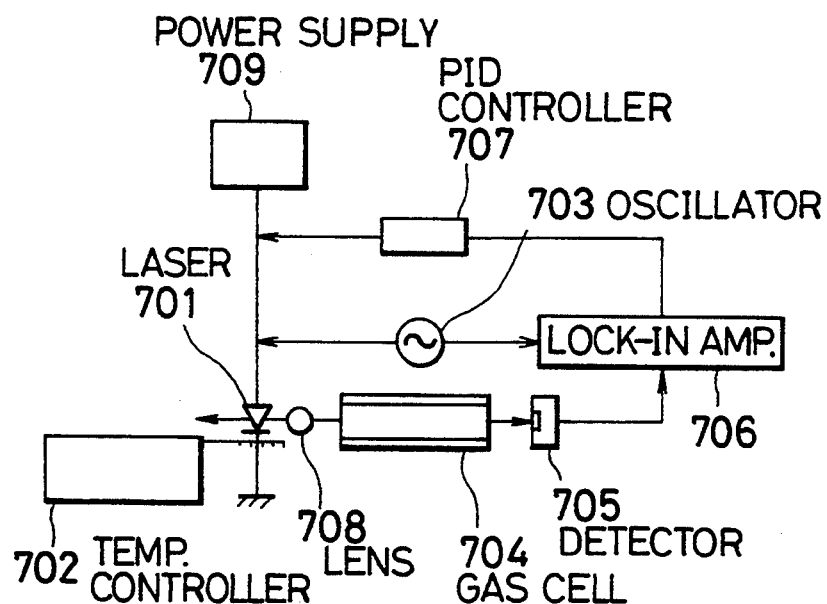
FIG. 1 is a functional block diagram showing a conventional frequency stabilization method of a semiconductor laser.
Figure 2:
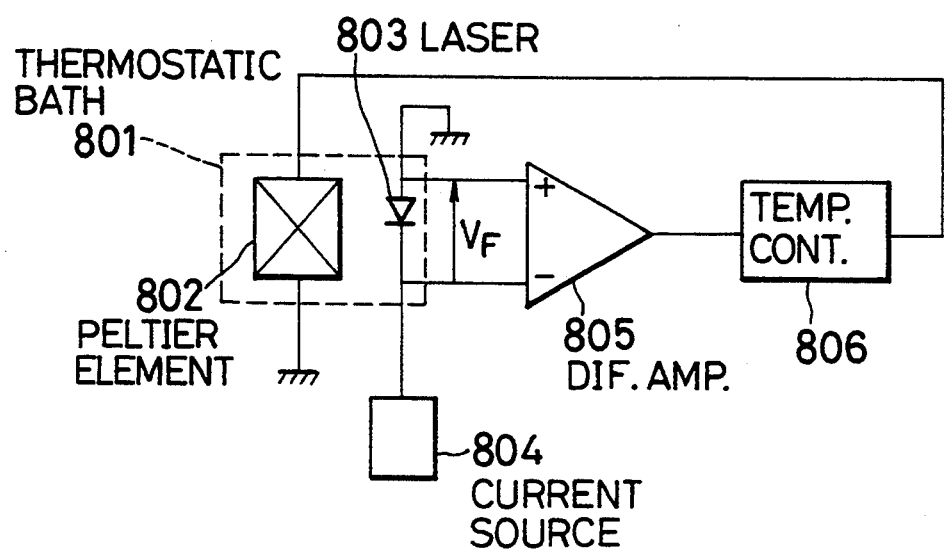
FIG. 2 is a functional block diagram showing another conventional frequency stabilization method of a semiconductor laser.

Preferred embodiments of the present invention will be described below while referring to the drawings attached.

First Embodiment

Figure 3:
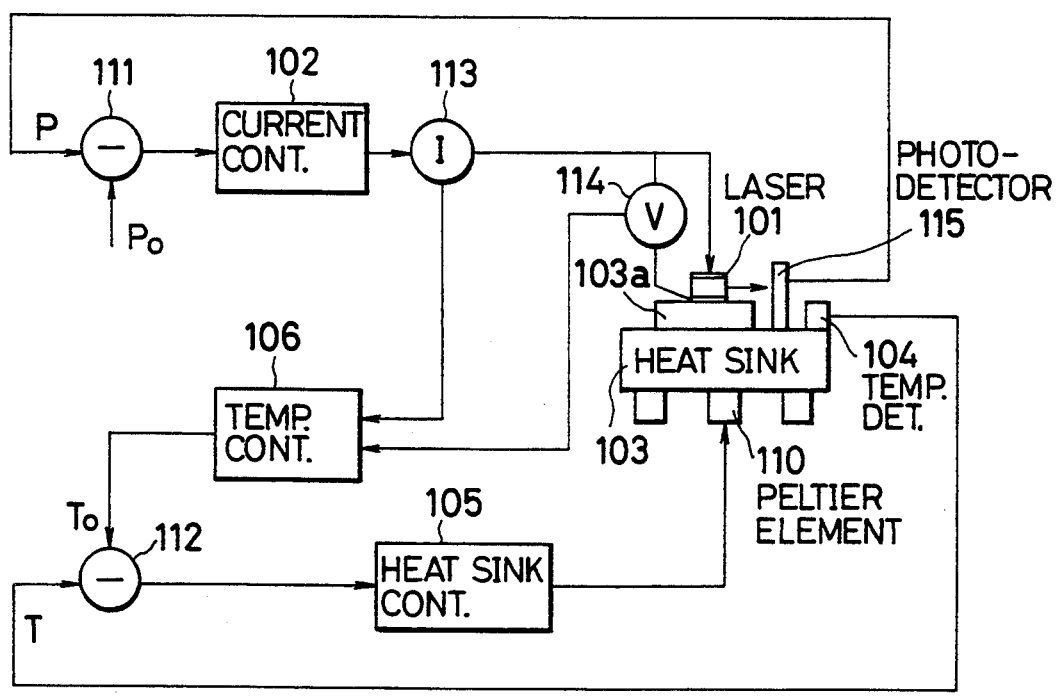
FIG. 3 is a functional block diagram of a frequency-stabilized light source according to a first embodiment of the present invention.

In FIG. 3, which shows a frequency-stabilized light source according to a first embodiment, a semiconductor laser 101 is mounted on a heat sink 103 through a subcarrier 103a. A photo-detector 115 fixed on the heat sink 103 receives an output light beam of the laser 101 to detect its power and outputs an electrical signal corresponding to the detected power P to a first subtractor 111.

The first subtractor 111 produces by subtraction a difference between the detected power P and the predetermined reference power $P_0$ and outputs an electrical signal corresponding to the power difference thus produced to a current controller 102. In response to this signal, the current controller 102 controls to increase or decrease a driving current for the laser 101 in order to keep or stabilize the power of the output light beam at $P_0$.

A current detector 113 is arranged in a current path between the current controller 102 and the laser 101 to detect the driving current. The current detector 113 outputs an electric signal corresponding to the driving current thus detected to a temperature controller 106. Thus, the driving current is always monitored by the temperature controller 106 during operation.

A voltage detector 114 is electrically connected between input terminals of the laser 101 to detect the voltage therebetween. The voltage detector 114 outputs an electric signal corresponding to the inter-terminal voltage thus detected to the temperature controller 106. Thus, the forward voltage of the laser 101 is always monitored by the temperature controller during operation.

The temperature controller 106 carriers out a mathematical operation to get the consumption power of the laser 101 based on the output signals from the current and voltage detectors 113 and 114. Then, the controller 106 increases or decreases the reference temperature $T_0$ of the heat sink 103 based on the result of the operation and sends an electric signal corresponding to the reference temperature $T_0$ to a second subtractor 112.

A temperature detector 104 fixed on the heat sink 103 detects the temperature of the heat sink 103. The detector 104 produces an electric signal corresponding to the detected temperature T to send the signal to the second subtractor 112.

The second subtractor 112 produces by subtraction a difference between the detected temperature T and the reference temperature $T_0$ and outputs an electrical signal corresponding to the temperature difference thus produced to a heat sink controller 105. In response to this signal, the heat sink controller 105 increases or decreases the temperature of the heat sink 103 in order to keep or stabilize the temperature at $T_0$.

The temperature control by the heat sink controller 105 is carried out using Peltier elements 110 attached to the heat sink 103. Since the Peltier elements 110 generate or absorb heat depending upon its driving current, the temperature of the heat sink 103 can be increased or decreased precisely by the elements 110.

Figure 3A:
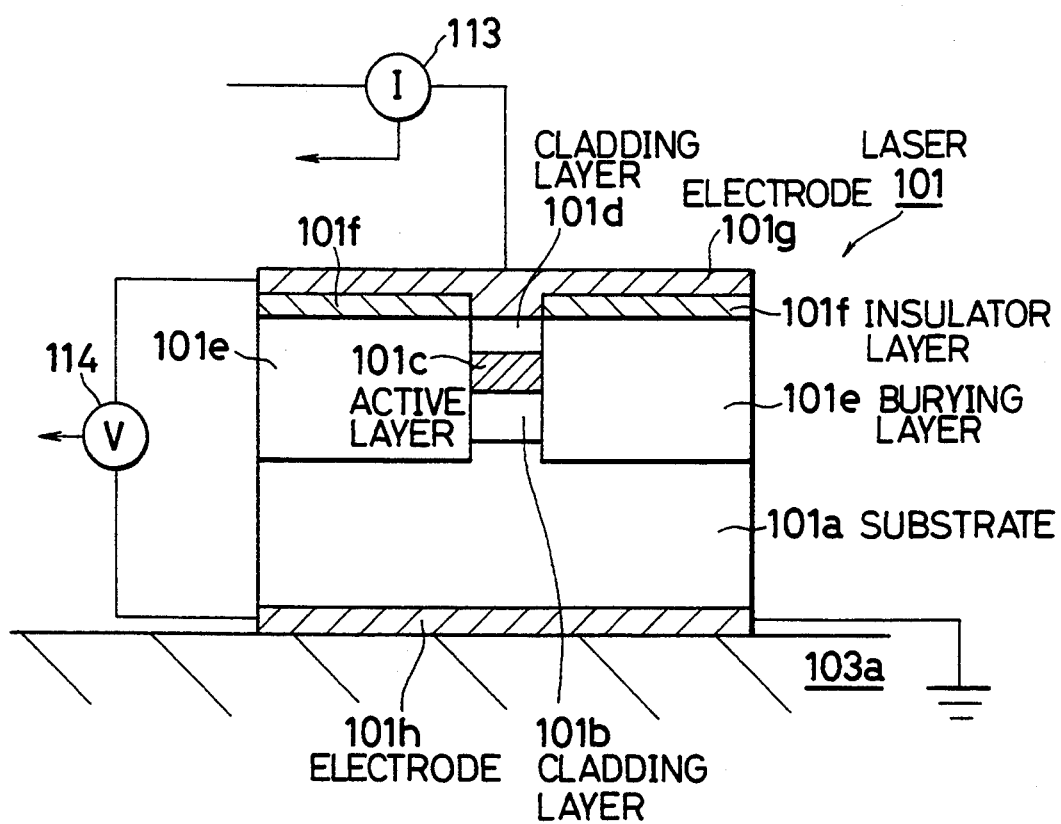
FIG. 3A schematically shows a cross section of a semiconductor laser used in the light source shown in FIG. 3.

FIG. 3A shows a cross section of the semiconductor laser 101 used in the light source shown in FIG. 3. In FIG. 3A, on the surface of a semiconductor substrate 101a, a strip portion formed of an active layer 101c and upper and lower cladding layers 101d and 101b respectively disposed on upper and lower sides of the active layer 101c. The strip portion is bounded on its each side by a pair of burying layers 101e formed on the surface of the substrate 101a.

A pair of insulator layers 101f are formed on the surfaces of the pair of the burying layers 101e, respectively. An upper electrode or terminal 101g is formed on the surfaces of the insulator layers 101f and the upper cladding layer 101d. A lower electrode or terminal 101h is formed on the back surface of the substrate 101a. The laser 101 is fixed to the subcarrier 103a through the lower electrode 101h.

The pair of the burying layer 101e act as current blocking layers for narrowing the driving current path.

The current detector 113 is electrically connected to the upper electrode 101g and the voltage detector 114 is electrically connected to the upper and lower electrodes 101g and 101h.

Next, the frequency stabilization operation of the semiconductor laser 101 is described below.

The semiconductor laser 101 tends to show a drift or deviation in oscillation frequency in a long period of time when the driving current is controlled so that the output light power of the laser 101 is kept constant and at the same time, the controlling current for the Peltier elements 110 is controlled so that the temperature of the heat sink 103 is kept constant.

It is considered that the drift or deviation in oscillation frequency is caused by change in percentage which contributes the laser oscillation within the total driving current injected into the laser 101. The change in percentage contributing laser oscillation is considered to be caused by (a) increase in leakage current due to deterioration of the current blocking layers or the pair of the burying layers 101e, and by (b) increase in recombination current without luminescence due to deterioration of the active layer 101c.

For example, when both of the output light power and the temperature are kept constant, the driving current percentage contributing laser oscillation tends to decrease, and the driving current increases to compensate the percentage decrease. Thus, the temperature of the active layer 101c rises in response to the increase in the driving current and as a result, the oscillation frequency of the laser 101 will drift toward the lower frequency side.

The drift $\Delta f$ of the oscillation frequency can be expressed as follows:

It is hardly considered that because an optical loss within the semiconductor laser 101 changes during operation in the long period of time, the carrier density in the laser 101 is kept substantially constant during operation and as a result, the oscillation frequency is not affected by the optical loss. Therefore, it is considered that the frequency change or drift $\Delta f$ is caused by the temperature change $\Delta T$ of the active layer 101c.

Under the first order approximation, the frequency change $\Delta f$ can be expressed as $$\Delta f = \frac{\partial f}{\partial T} \cdot \Delta T \tag{2}$$

The equation (2) means that the frequency change $\Delta f$ is zero if the temperature of the active layer 101c is constant, that is, the temperature difference $\Delta T$ is zero.

The temperature of the semiconductor layer 101 can be controlled to be kept constant by the heat sink controller 105, however, there arises a temperature difference between the active layer 101c and the heat sink 103 because of heat resistance between the active layer 101c and the temperature detector 104 when the consumption power of the laser 101 changes.

The temperature change $\Delta T$ of the active layer 101c is expressed as $$\Delta T = \Theta \cdot \Delta W + \Delta T_0 \tag{3}$$

where $\Delta W$ is the consumption power change of the active layer 101c, $\Theta$ is the heat resistence between the active layer 101c and the temperature detector 104 and $\Delta T_0$ is the change of the reference temperature of the heat sink 103.

Consequently, it is seen that the temperature change $\Delta T_0$ can be cancelled if the following equation (4) is established, resulting in a stabilized oscillation frequency.

$$\Delta T_0 = -\Theta \cdot \Delta W \tag{4}$$

Here, the total driving current $i_t$ and the forward voltage v between the input electrodes 101g and 101h can be expressed as the following equations (5a) and (5b) using the initial, total driving current $i_{t0}$, the initial forward voltage $v_0$, the change $\Delta i_t$ of the total driving current $i_t$, and the change $\Delta v$ of the forward voltage.

$$i_t = i_{t0} + \Delta i_t \tag{5a}$$

$$v = v_0 + \Delta v \tag{5b}$$

From the equations (5a) and (5b), the consumption power change $\Delta W$ of the active layer 101c can be expressed as $$\begin{aligned}\Delta W &= W - W_0 = i_t \cdot v - i_{t0} \cdot v_0 \\ &= \Delta i_t \cdot v_0 + i_{t0} \cdot \Delta v + \Delta i_t \cdot \Delta v\end{aligned} \tag{6}$$

The reference temperature $T_0$ of the heat sink 103 is controlled by the heat sink controller 105 so that the consumption power change $\Delta W$ expressed by the equation (6) is cancelled.

The temperature controller 106 calculates in value the consumption power change $\Delta W$ using the equations (4) and (6) based on the electric signals from the current and voltage detectors 113 and 114. Then, the controller 106 adjusts in value the reference temperature $T_0$ to cancel the calculated value of the consumption power change $\Delta W$.

As described above, with the light source according to the first embodiment, the current controller 102 controls the driving current for the semiconductor laser 101 so that the output light power of the laser 101 is kept constant, and at the same time, the temperature controller 106 and the heat sink controller 105 control the reference temperature $T_0$ of the heat sink 103 so that the temperature change of the active layer 101c is cancelled.

As a result, the oscillation frequency of the laser 101 can be stabilized because of no oscillation frequency drift due to electrical and optical characteristic changes of the laser 101 with passage of time.

Additionally, no gas cell and no synchronous detection means such as a lock-in amplifier are required, so that there arises an advantage that a simple, compact and low-cost setup is sufficient for the light source.

Second Embodiment

Figure 4:
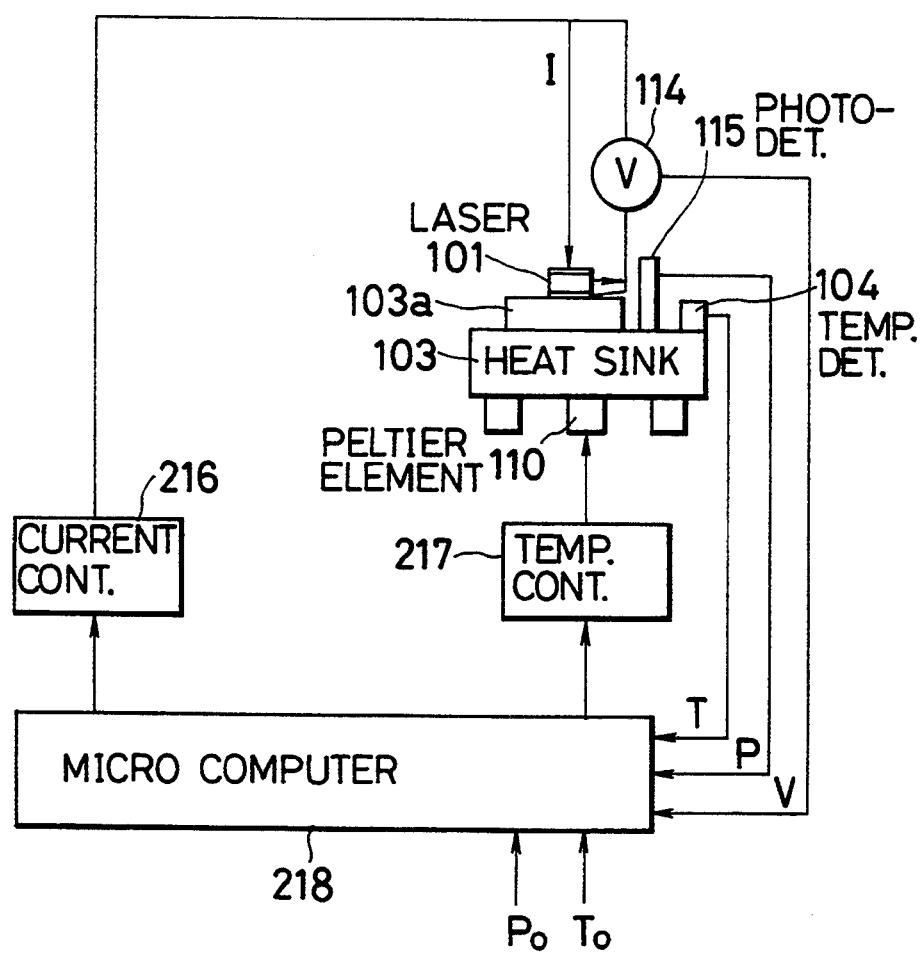
FIG. 4 is a functional block diagram of a frequency-stabilized light source according to a second embodiment of the present invention.

FIG. 4 shows a frequency-stabilized light source according to a second embodiment of the present invention. In FIG. 4, the same reference numerals as those in FIG. 3 are attached to the corresponding elements for the sake of simplification of description and illustration.

A current control circuit 216 for controlling the driving current I for the semiconductor laser 101, a temperature control circuit 217 for controlling the temperature of the heat sink 103, and a micro computer 21 for controlling the circuits 216 and 217 are provided instead of the current controller 102, the temperature controller 106 and the heat sink controller 105 in FIG. 3.

The temperature detector 104 sends an electric signal corresponding to the detected temperature T of the heat sink 103 to the micro computer 218. The photodetector 115 sends an electric signal corresponding to the detected light power P of the laser 101 to the micro computer 218. The voltage detector 114 sends an electric signal corresponding to the detected voltage V of the laser 101 to the micro computer 218.

The micro computer 218 is storing data relating the reference power $P_0$ and the reference temperature $T_0$ in advance. The computer 218 calculates data using the signal about the output light power P from the photodetector 115 and sends the data to the current control circuit 216. In response to the data thus sent, the current control circuit 216 controls to supply the driving current to the semiconductor laser 101, so that the output light power from the laser 101 is kept constant.

On the other hand, the computer 218 calculates data using the signals about the forward voltage V from the voltage detector 114 and the temperature T from the temperature detector 104, and sends the data to the temperature control circuit 217. In response to the data thus sent, the temperature control circuit 217 controls to supply the driving current to the Peltier elements 110, so that the reference temperature $T_0$ of the heat sink 103 is adjusted in order to cancel the temperature change of the active layer 101c.

Therefore, in the second embodiment, the same effects as those the first embodiment can be obtained. Additionally, there is an advantage that the configuration or setup can be made simpler than that of the first embodiment because of the micro computer 218.

Third Embodiment

Figure 5:
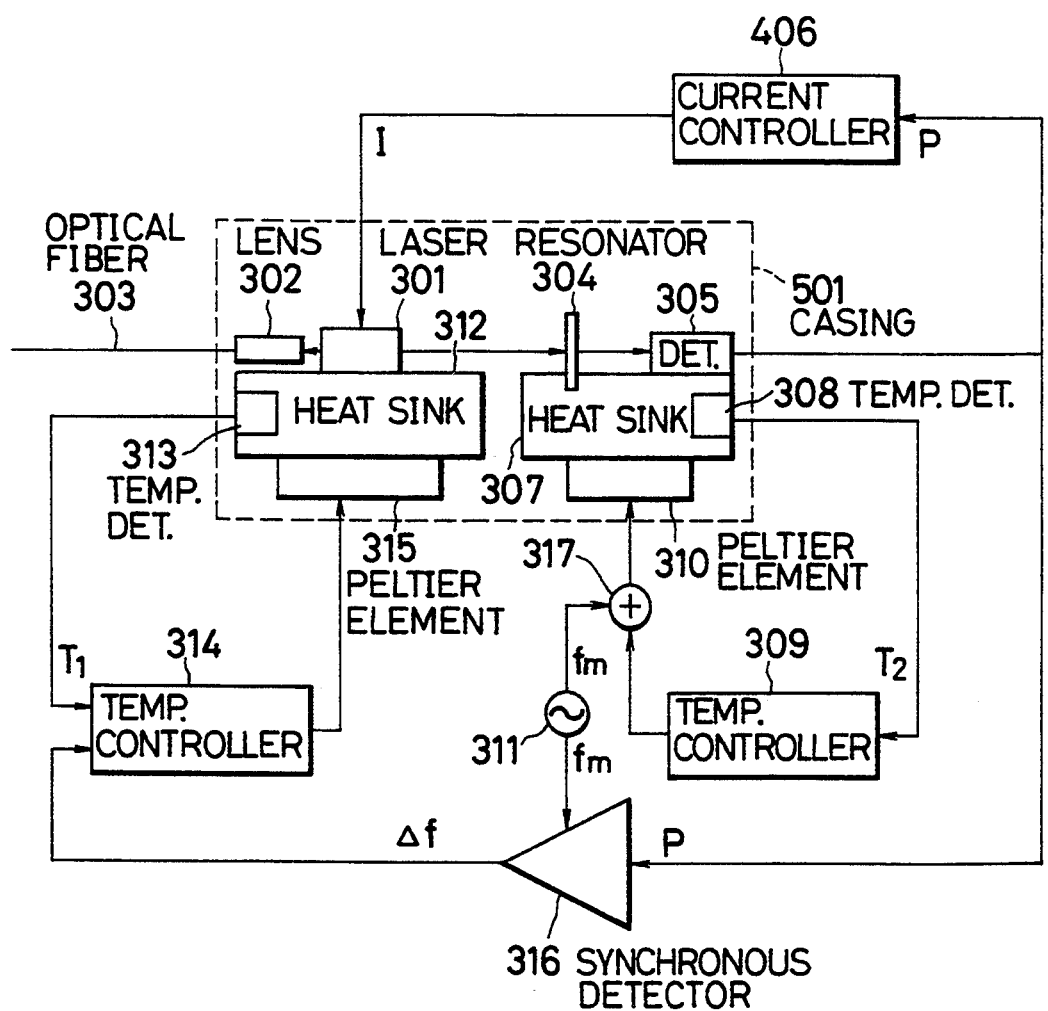
FIG. 5 is a functional block diagram of a frequency-stabilized light source according to a third embodiment of the present invention.

FIG. 5 shows a frequency-stabilized light source according to a third embodiment of the present invention.

In FIG. 5, a semiconductor laser 301, which is fixed on a first heat sink 112, emits an output light beam from its one side face and the emitted light beam is injected into an optical fiber 303 optically coupled with the laser 101 through a lens system 302.

A first temperature detector 313 and a first Peltier element 315 are fixed to the first heat sink 312. The detector 313 and the element 315 act to control the temperature of the first heat sink 312 together with a first temperature controller 314, providing the temperature control of the laser 301.

The first temperature controller 314 receives an electric signal about the temperature $T_1$ of the first heat sink 312 from the first temperature detector 313. On the other hand, the first temperature controller 314 receives an electric signal about the frequency difference or drift $\Delta f$ from a synchronous detector 316. Based on the signals thus received, the controller 314 controls a driving current for the first Peltier element 315 to increase or decrease the temperature of the first heat sink 312.

Thus, the temperature $T_1$ of the semiconductor laser 301 is controlled to be kept constant.

Another output light beam of the laser 301 is emitted from its opposite side face and is injected into an optical resonator 304 fixed on a second heat sink 307. The optical resonator 304 is composed of, for example, an optical filter formed of a dielectric multilayer film, a Fabry-Perot etalon or the like. The second heat sink 307 is arranged apart from and adjacent to the first heat sink 312.

The light beam transmitted through the optical resonator 304 goes into photodetector 305 fixed on the second heat sink 307. The photodetector 305 produces an electric signal corresponding to the detected power P of the light beam and sends the signal to a current controller 406 and the synchronous detector 316.

The current controller 406 controls a driving current I for the laser 103 so that the average output from the photodetector 305 is kept constant.

A second temperature detector 308 and a second Peltier element 310 are fixed to the second heat sink 307. The detector 308 and the element 310 act to control the temperature of the second heat sink 307 together with a second temperature controller 309, providing the temperature control of the optical resonator 304.

The second temperature detector 309 receives an electric signal corresponding to the detected temperature $T_2$ of the second heat sink 307 from the second temperature detector 308. Based on the signal thus received, the controller 309 controls a driving current for the second Peltier element 310 to increase or decrease the temperature of the second heat sink 307.

The output signal from the second temperature controller 309 is slightly modulated by a modulation signal and is sent to the second Peltier element 310. The modulation signal is supplied from an oscillator 311 and whose frequency is $f_a$.

Thus, the temperature of the optical resonator 304 is modulated by the modulation signal and at the same time, the temperature $T_1$ is controlled so that the time average of the temperature $T_1$ is kept constant.

The synchronous detector 316 detects the output signal from the photodetector 305 synchronously with the modulation signal from the oscillator 311. The optical resonator 304 such as a dielectric multilayer film filter or a Fabry-Perot etalon has a peak frequency for the transmitted light beam, which can be approximated by the Lorentz function or Gauss function. In addition, an electric output signal from the synchronous detector 316 has a waveform equal to the primary-differentiated waveform of the transmitted light beam at the peak frequency, so that the output signal is approximately proportional to the difference $\Delta f$ between the frequency of the output light beam injected into the optical resonator 304 and the peak frequency of the transmitted light beam through the resonator 304. This means that the electrical output signal from the synchronous detector 316 is available as a signal showing the frequency difference or error $\Delta f$.

the output signal from the synchronous detector 316 is sent to the first temperature controller 314. Then, the temperature of the semiconductor laser 301 is controlled by the controller 314 so that the oscillation frequency of the output light beam from the laser 301 is kept in accordance with the peak frequency of the transmitted light beam through the optical resonator 304. As a result, the oscillation frequency of the output light from the laser 301 is kept constant.

In the third embodiment, similar to the first and second embodiments, since no gas cell is necessary, a simple, compact and low-cost light source can be realized. Since the driving current is not modulated, an unmodulated output light can be provided easily.

Also, the semiconductor laser 301, the optical lens system 302, the optical resonator 304, the photodetector 305, the first and second heat sinks 312 and 307, the first and second temperature detectors 313 and 308, and the first and second Peltier elements 315 and 310 are incorporated into a casing 501, providing a semiconductor laser module. Therefore, there is an advantage of more stable operation and more compact size.

In addition, stabilization in both oscillation frequency and output light power can be realized only by the photodetector 305.

Fourth Embodiment

Figure 6:
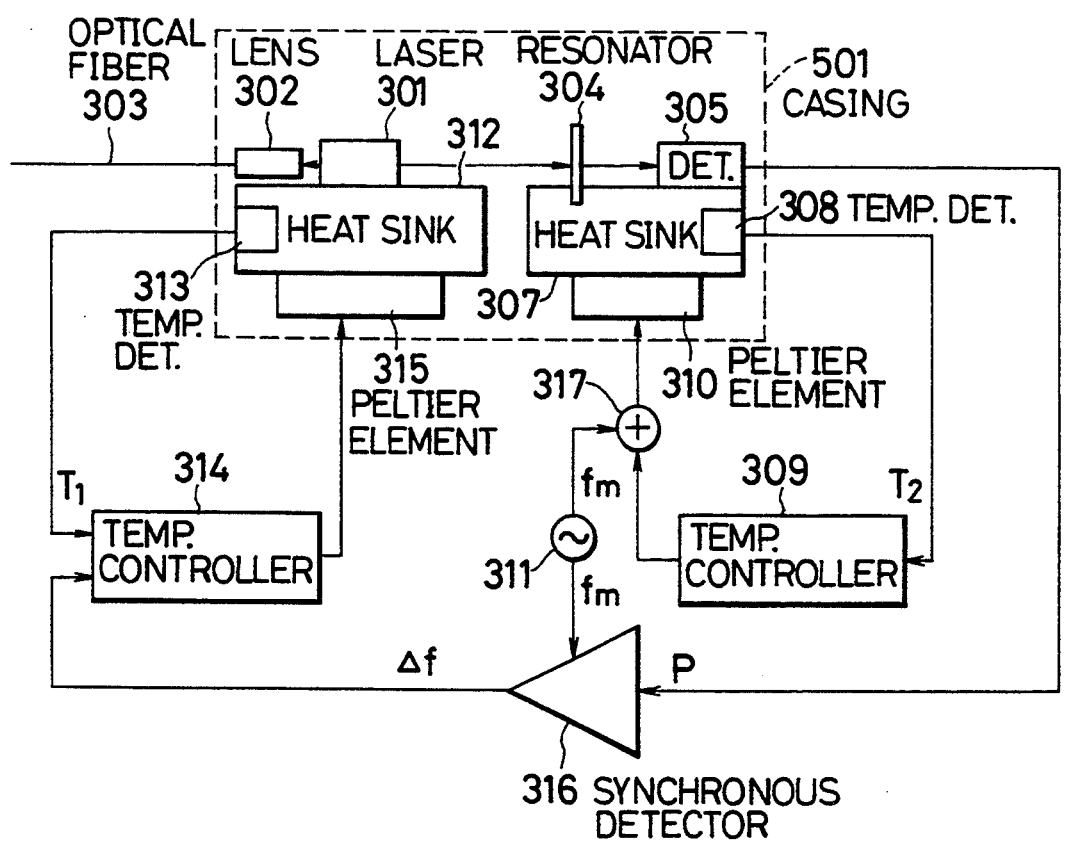
FIG. 6 is a functional block diagram of a frequency-stabilized light source according to a fourth embodiment of the present invention.

FIG. 6 shows a frequency-stabilized light source according to a fourth embodiment, which is the same configuration as that of the third embodiment excepting that the current controller 406 in the third embodiment is omitted.

In the fourth embodiment, in response to the detected power P of the light beam transmitted through the optical resonator 304, the photodetector 305 produces an electric signal corresponding to the detected power P and sends the signal only to the synchronous detector 316. The driving current I for the laser 301 is not controlled because of no current controller.

Since the driving current I for the semiconductor laser 301 is not controlled, the power of the output light beam from the laser 301 does not necessarily stabilized, however, there is an advantage that the configuration becomes simpler than that of the third embodiment.

Fifth Embodiment

FIG. 7 shows a frequency-stabilized light source according to a fifth embodiment, in which the temperature of the semiconductor laser 301 is controlled so that the output light power of the laser 301 is kept constant and the driving current for the laser 301 is controlled so that the oscillation frequency of the output light beam is kept constant.

In FIG. 7, the same reference numerals as those in FIG. 5 are attached to the corresponding elements for the sake of simplification of description and illustration.

Different from the third embodiment in FIG. 5, a current controller 606 is arranged between the synchronous detector 316 and the semiconductor laser 301.

The first temperature controller 314 receives an electric signal corresponding to the temperature $T_1$ of the first heat sink 312 from the first temperature detector 313. On the other hand, the first temperature controller 314 receives an electric signal corresponding to the output light power P from the photodetector 305. Based on the signals thus received, the controller 314 controls the driving current for the first Peltier element 315 to increase or decrease the temperature of the first heat sink 312.

Thus, the output light power of the semiconductor laser 301 is controlled to be kept constant.

The electrical output signal corresponding the detected power P of the output light, which is outputted from the photodetector 305, is sent to the synchronous detector 316. The detector 316 detects the signal thus sent synchronously with the modulation frequency $f_a$ from the oscillator 311 and produces an electric signal proportional to the frequency difference $\Delta f$. The signal thus produced is then sent to the current controller 606.

The output signal from the second temperature controller 309 is slightly modulated by a modulation signal whose frequency is $f_a$ and is sent to the second Peltier element 310.

The current controller 606 controls a driving current I for the laser 301 so that the oscillation frequency of the laser 301 is kept constant.

Thus, the temperature of the optical resonator 304 is modulated by the modulation signal from the oscillator 311 and at the same time, the temperature is controlled so that the time average of the temperature is kept constant.

In the fifth embodiment, the same effects or advantages as those in the third embodiment can be obtained.

In the present invention, any control means such as analog control means using the PID control method, digital control means using micro computers or the like can be employed as the controllers above described.

It is needless to say that the present invention is not restricted to the above first to fifth embodiments, and any other variations can be made.

What is claimed is:

1. A frequency stabilization method of a semiconductor laser, said method comprising the steps of:
   detecting an output light power of a semiconductor laser mounted on a heat sink;
   obtaining a consumption power of said laser;
   obtaining a relationship between said output light power and said consumption power;
   detecting a temperature of said heat sink;
   controlling a driving current for the laser so that said output light power is kept constant; and controlling said temperature of said heat sink based on said relationship so that a temperature of an active layer of said laser is maintained.

2. A frequency stabilization method of a semiconductor laser as claimed in claim 1, further comprising the steps of:
  detecting said driving current of said semiconductor laser; and
  detecting a voltage drop of said laser;
  wherein said relationship between said output light power and said consumption power is obtained based on detection results of said driving current and said voltage.

3. A frequency-stabilized light source, comprising:
  a light power detector for detecting an output light power of a semiconductor laser mounted on a heat sink;
  a first means for obtaining a consumption power of said laser;
  a second means for obtaining a relationship between said output light power and said consumption power;
  a temperature detector for detecting a temperature of said heat sink;
  a first controller for controlling said driving current so that said output light power is kept constant; and
  a second controller for controlling said temperature of said heat sink based on said relationship so that a temperature of an active layer of said laser is maintained.

4. A frequency-stabilized light source as claimed in claim 3, further comprising:
  a current detector for detecting said driving current of said semiconductor laser; and
  a voltage detector for detecting a voltage drop of said laser;
  wherein said relationship between said output light power and said consumption power is obtained based on detection results of said driving current and said voltage.

5. A frequency stabilization method of a semiconductor laser, said method comprising the steps of:
  injecting an output light beam from a semiconductor laser into an optical resonator;
  modulating temperature of said optical resonator by a modulation signal;
  detecting a transmitted light beam through said optical resonator to produce a first output signal;
  synchronously detecting said first output signal with said modulation frequency to produce a second output signal;
  controlling an oscillation frequency of said semiconductor laser to keep said frequency at a given value using said second output signal as a signal showing an error in said oscillation frequency.

6. A frequency stabilization method of a semiconductor laser as claimed in claim 5, wherein, said oscillation frequency of said semiconductor laser is controlled in accordance with a peak frequency of said optical resonator in said step of controlling an oscillation frequency.

7. A frequency stabilization method of a semiconductor laser as claimed in claim 5, wherein, said semiconductor laser is mounted on a first heat sink and is controlled to be at a constant temperature, and wherein said optical resonator is mounted on a second heat sink and said temperature of said optical resonator is modulated through said second heat sink.

8. A frequency stabilization method of a semiconductor laser as claimed in claim 5, wherein, a driving current for said semiconductor laser is controlled so that an output light power from said laser is kept constant.

9. A frequency stabilization method of a semiconductor laser as claimed in claim 5, wherein, a temperature of said semiconductor laser is controlled so that an output light power from said laser is kept constant.

10. A frequency stabilization method of a semiconductor laser as claimed in claim 5, wherein, a driving current for said semiconductor laser is controlled so that said oscillation frequency of said laser is kept at a given value.

11. A frequency stabilization method of a semiconductor laser as claimed in claim 5, wherein, a temperature of said semiconductor laser is controlled so that said oscillation frequency of said laser is kept at a given value.

12. A frequency-stabilized light source comprising:
  a semiconductor laser emitting an output light beam;
  an optical resonator into which said output light beam is injected;
  a modulator for modulating a temperature of said optical resonator by a modulation signal;
  a detector for detecting a transmitted light beam through said optical resonator to produce a first output signal;
  a synchronous detector for synchronously detecting said first output signal with said modulation frequency to produce a second output signal;
  a controller for controlling an oscillation frequency of said semiconductor laser to keep said frequency at a given value using said second output signal as a signal showing an error in said oscillation frequency.

13. A frequency-stabilized light source as claimed in claim 12, wherein, said oscillation frequency of said semiconductor laser is controlled in accordance with a peak frequency of said optical resonator.

14. A frequency-stabilized light source as claimed in claim 12, wherein, said semiconductor laser is mounted on a first heat sink and is controlled to be at a constant temperature, and wherein said optical resonator is mounted on a second heat sink and said temperature of said optical resonator is modulated through said second heat sink.

15. A frequency-stabilized light source as claimed in claim 12, wherein, a driving current for said semiconductor laser is controlled so that an output light power from said laser is kept constant.

16. A frequency-stabilized light source as claimed in claim 12, wherein, a temperature of said semiconductor laser is controlled so that an output light power from said laser is kept constant.

17. A frequency-stabilized light source as claimed in claim 12, wherein, a driving current for said semiconductor laser is controlled so that said oscillation frequency of said laser is kept at a given value.

18. A frequency-stabilized light source as claimed in claim 12, wherein, a temperature of said semiconductor laser is controlled so that said oscillation frequency of said laser is kept at a given value.

19. A frequency stabilization method of a semiconductor laser; said method comprising the steps of:
  injecting an output light beam from a semiconductor laser into an optical resonator to produce a transmitted light having a peak frequency of said optical resonator;

detecting said transmitted light beam having said peak frequency to produce an output signal about a detected power of said transmitted light beam;

controlling said power of said transmitted light beam to be kept constant based on said output signal; and controlling an oscillation frequency of said semiconductor laser in accordance with said peak frequency.

20. A frequency-stabilized light source comprising:

a semiconductor laser emitting an output light beam;

an optical resonator into which said output light beam is injected;

said resonator producing a transmitted light beam and having a peak frequency of said transmitted light beam;

a detector for detecting said transmitted light beam to produce an output signal about a detected power of said transmitted light beam;

a first controller for controlling said power of said transmitted light beam to be kept constant based on said output signal; and a second controller for controlling an oscillation frequency of said semiconductor laser in accordance with said peak frequency.

21. A semiconductor laser module comprising:

a first heat sink having a controllable temperature;

a semiconductor laser mounted on said first heat sink;

said semiconductor laser emitting an output light beam;

a second heat sink having a controllable temperature;

an optical resonator mounted on said second heat sink;

said output light beam being injected into said optical resonator to emit a transmitted light beam from said optical resonator;

a detector for receiving said transmitted light beam to detect a power of said transmitted light beam; and a package for incorporating said first heat sink; said semiconductor laser, said second heat sink; said optical resonator and said detector.

22. A semiconductor laser module as claimed in claim 21, wherein, a temperature of said optical resonator is modulated by a modulation signal;

a transmitted light beam through said optical resonator is used to produce a fist output signal;

a power of said transmitted light beam is controlled to be kept constant based on said first output signal;

said first output signal is synchronously detected with said modulation frequency to produce a second output signal; and an oscillation frequency of said semiconductor laser is controlled to keep said frequency at a given value using said second output signal as a signal showing an error in said oscillation frequency.

23. A semiconductor laser module as claimed in claim 22, wherein, said oscillation frequency of said semiconductor laser is controlled in accordance with a peak frequency of said optical resonator in said step of controlling an oscillation frequency.

24. A semiconductor laser module as claimed in claim 22, wherein, said semiconductor laser is controlled to be at a constant temperature through said first heat sink, and said optical resonator is modulated through said second heat sink.

* * * * *